(12) United States Patent
Chandrasekaran et al.

(10) Patent No.: US 6,930,547 B2
(45) Date of Patent: Aug. 16, 2005

(54) LINEARIZING LINC AMPLIFIERS USING PRE-DISTORTION

(75) Inventors: Rajiv Chandrasekaran, Basking Ridge, NJ (US); Andrew Dodd, Martinsville, NJ (US)

(73) Assignee: Andrew Corporation, Orland Park, IL (US)

( * ) Notice: Subject to any disclaimer, the term of this patent is extended or adjusted under 35 U.S.C. 154(b) by 72 days.

(21) Appl. No.: 10/634,600

(22) Filed: Aug. 5, 2003

(65) Prior Publication Data

US 2004/0027198 A1 Feb. 12, 2004

Related U.S. Application Data

(60) Provisional application No. 60/402,168, filed on Aug. 9, 2002.

(51) Int. Cl.$^7$ .................................. H03F 1/26
(52) U.S. Cl. .................. 330/124 R; 330/149
(58) Field of Search .................... 330/10, 124 R, 330/136, 149

(56) References Cited

U.S. PATENT DOCUMENTS

| | | | |
|---|---|---|---|
| 4,433,312 A | 2/1984 | Kahn | 332/22 |
| 5,012,200 A | 4/1991 | Meinzer | 330/124 R |
| 6,046,635 A | 4/2000 | Gentzler | 330/149 |
| 6,252,461 B1 * | 6/2001 | Raab | 330/302 |
| 6,314,142 B1 | 11/2001 | Perthold et al. | 375/296 |
| 6,359,506 B1 | 3/2002 | Camp, Jr. et al. | 330/124 R |
| 6,570,444 B2 | 5/2003 | Wright | 330/149 |
| 6,577,192 B2 | 6/2003 | Maniwa et al. | 330/149 |
| 2002/0127986 A1 | 9/2002 | White et al. | 455/194.2 |
| 2003/0107434 A1 | 6/2003 | Mitzlaff | 330/149 |

OTHER PUBLICATIONS

"Efficiency of Outphasing RF Power-Amplifier Systems" by Frederick H. Raab, IEEE Transactions on Communications, vol. Com-33, No. 10, Oct. 1985, pp. 1094-1099.

* cited by examiner

Primary Examiner—Steven J. Mottola
(74) Attorney, Agent, or Firm—Steve Mendelsohn

(57) ABSTRACT

An input signal having amplitude information is pre-distorted and converted into two pre-distorted signals without amplitude information. The two pre-distorted signals are separately amplified and then recombined to generate a linearized amplified output signal having amplitude information. The pre-distortion and conversion may be implemented using a pre-distorter and a LINC modulator. Alternatively, the pre-distortion and conversion may be implemented in circuitry that combines the functions of a pre-distorter and a LINC modulator. The amplified, pre-distorted signals are preferably combined using circuitry that provides at least some impedance matching, such as a transformer or a transmission line tee with transmission line stubs.

22 Claims, 5 Drawing Sheets

US 6,930,547 B2

LINEARIZING LINC AMPLIFIERS USING PRE-DISTORTION

CROSS-REFERENCE TO RELATED APPLICATIONS

This application claims the benefit of the filing date of U.S. provisional application No. 60/402,168, filed on Aug. 9, 2002.

FIELD OF THE INVENTION

The present invention relates to signal processing, and, in particular, to techniques for linearizing amplifiers used in communications systems.

BACKGROUND OF THE INVENTION

Both high efficiencies and high linearities can be achieved in RF amplifiers using a set of techniques known as amplitude reconstruction. In amplitude reconstruction, the amplitude information of a signal is removed, and the remaining phase-modulated signal is amplified using a highly efficient nonlinear amplifier. After amplification, the amplitude information is somehow returned to the signal.

One such technique for amplitude reconstruction is LINC (LInear amplification with Nonlinear Components), also referred to in older literature as outphasing. In this technique, the amplitude information in the signal is converted into phase modulation for two different signals. The phase modulation is performed in such a manner that when the two signals are amplified and then recombined, the resulting signal has the desired output amplitude. If the input signal has zero amplitude, then the two amplified signals will be 180 degrees out-of-phase and will cancel when recombined. If the input signal is at maximum amplitude, then the two amplified signals will be in-phase and will combine perfectly.

FIG. 1 is a block diagram of a LINC system 100 of the prior art. LINC system 100 comprises LINC modulator 102, power amplifiers PA1 and PA2, and combiner 104. The input signal to LINC system 100 is an amplitude-modulated carrier represented as A sin(ωt+φ). LINC modulator 102 generates two signals with phases $\phi + \cos^{-1}(A)$ and $\phi - \cos^{-1}(A)$. These two signals are then amplified by amplifiers PA1 and PA2, respectively, and combined by combiner 104 to produce an amplified replica γ of the input signal. Peak output is obtained when the two amplifiers add in-phase; zero output is obtained when they add out-of-phase. Intermediate phase values produce intermediate amplitudes.

In phasor notation, the input signal may be written as in Equation (1) as follows:

$$u = A e^{j\phi}. \quad (1)$$

The outputs of amplifiers PA1 and PA2 may be written as in Equations (2) and (3) as follows:

$$V_1 = G e^{+j(\phi - \cos^{-1} A)} \quad (2)$$

and $$V_2 = G e^{+j(\phi + \cos^{-1} A)}, \quad (3)$$

where G is the gain of both power amplifier PA1 and power amplifier PA2. The output γ of combiner 104 may be written as in Equation (4) as follows:

$$\gamma = 2GA e^{j\phi}. \quad (4)$$

There are two common methods for combining the two amplified signals generated by amplifiers PA1 and PA2. These two methods are described below in the context of FIGS. 2 and 3.

FIG. 2 shows a block diagram of a LINC system 200 of the prior art that employs a first method for combining the amplified signals generated by two power amplifiers. LINC system 200 has a LINC modulator and two power amplifiers that are analogous to those in LINC system 100 of FIG. 1. In LINC system 200, combiner 104 of FIG. 1 is implemented using a four-port hybrid combiner 204, also known as a power combiner. Combiner 204 receives the amplified signals from amplifiers PA1 and PA2 as two inputs and generates the sum and difference of the two signals as its two outputs. The sum is an amplified version of the input signal to the LINC system, while the difference signal is wasted in a dummy load. The advantage to such a technique is that each amplifier sees a perfectly matched load. However, some power is wasted in the dummy load, resulting in a loss of efficiency. (Note that, at zero input amplitude, all power is wasted in the difference port.)

FIG. 3 shows a block diagram of a LINC system 300 of the prior art that employs a second method for combining the amplified signals generated by two power amplifiers. Like LINC system 200, LINC system 300 has a LINC modulator and two power amplifiers that are analogous to those in LINC system 100 of FIG. 1. In LINC system 300, combiner 104 of FIG. 1 is implemented using a three-port, lossless combiner 304. Combiner 304 is implemented using a transmission line tee 306 with transmission line stubs (e.g., shunt reactances) 308 and 310 for impedance matching. Alternatively, combiner 304 may be implemented using a transformer. In either case, this LINC system has the advantage of efficiency over the four-port hybrid technique of LINC system 200, since no power is lost in the combiner. Unfortunately, the amplifiers no longer see perfectly matched loads at all output amplitudes. As a result, while the combiner itself is extremely efficient, most amplifiers that are used in such systems lose efficiency when connected to mismatched loads. In addition, their power outputs and phases may vary with the output amplitude of the system.

LINC system 300 uses shunt reactances ($jB_S$ and $-jB_S$ in FIG. 3) to improve the efficiency of a basic three-port system to improve amplifier matching at output amplitudes other than the maximum amplitude. In particular, shunts 308 and 310 are preferably placed at the electrical equivalent of one-quarter wavelength away (e.g., via quarter-wave delays 312 and 314) from combiner tee 306, where the shunts improve the load matching at a variety of output amplitudes. This greatly increases efficiency and linearity at some output amplitudes at the expense of some efficiency and linearity in other amplitudes. The optimum compensation depends heavily on the peak-to-average ratio of the signal to be amplified.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
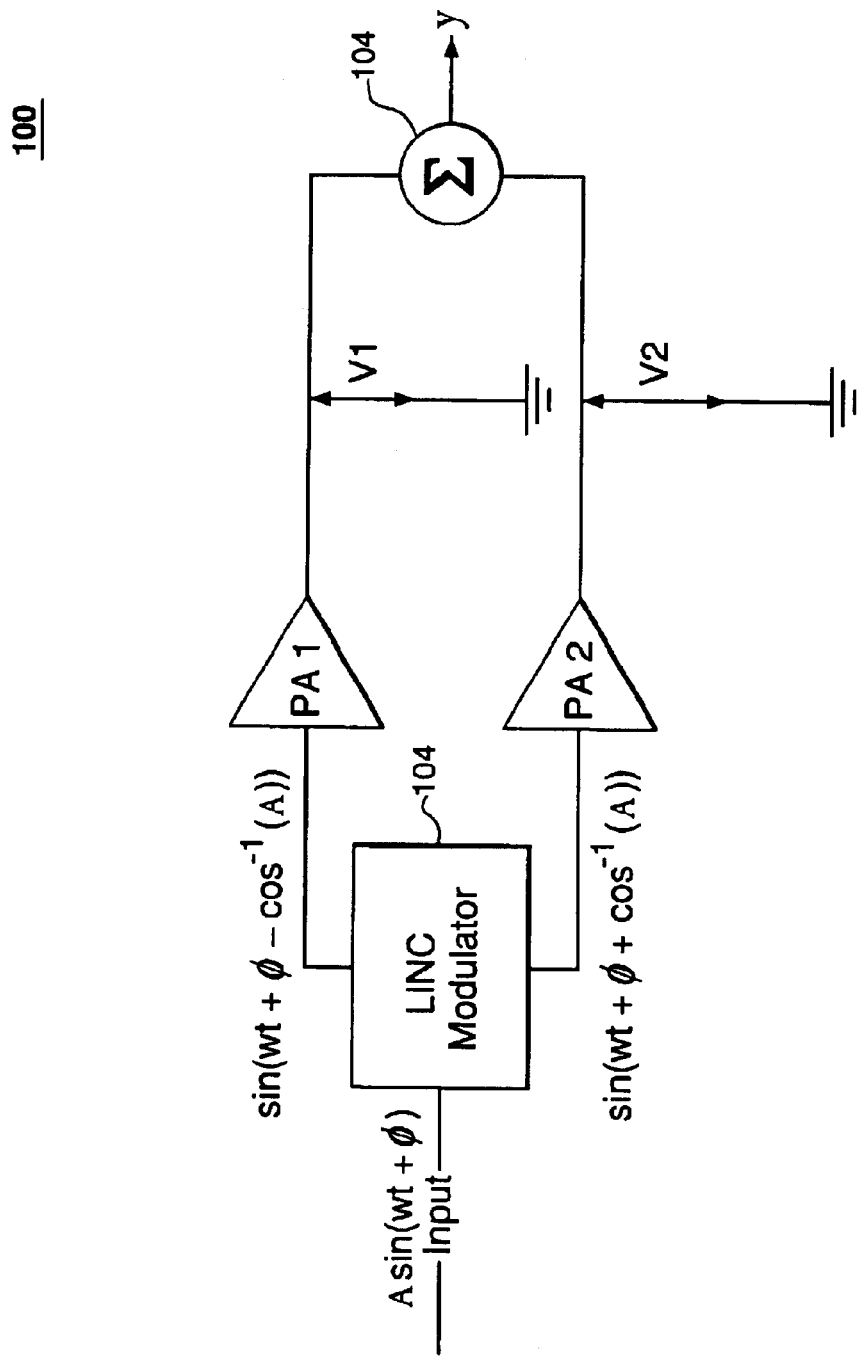
FIG. 1 is a block diagram of a LINC system of the prior art.
Figure 2:
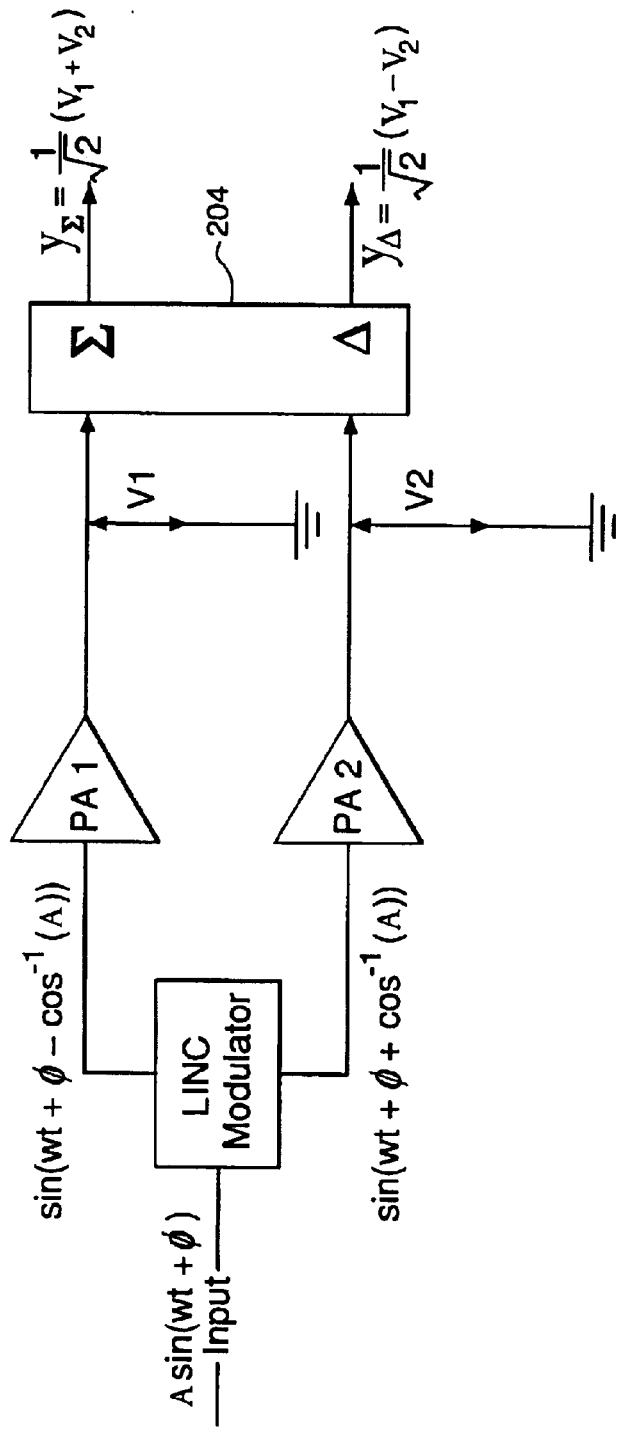
FIG. 2 shows a block diagram of a LINC system of the prior art that employs a first method for combining the amplified signals generated by two power amplifiers.

Despite the efficiency benefits of LINC systems using four-port hybrid combiners or three-port lossless combiners, LINC systems are typically not linear enough for use with many modern signals. In the case of the four-port hybrid combiner of FIG. 2, a small difference in the gain or phase offsets of each amplifier will result in different powers going into the combiner. As a result, the phase component of one signal will dominate over the other, which will result in distortion at the output signal.

Figure 3:
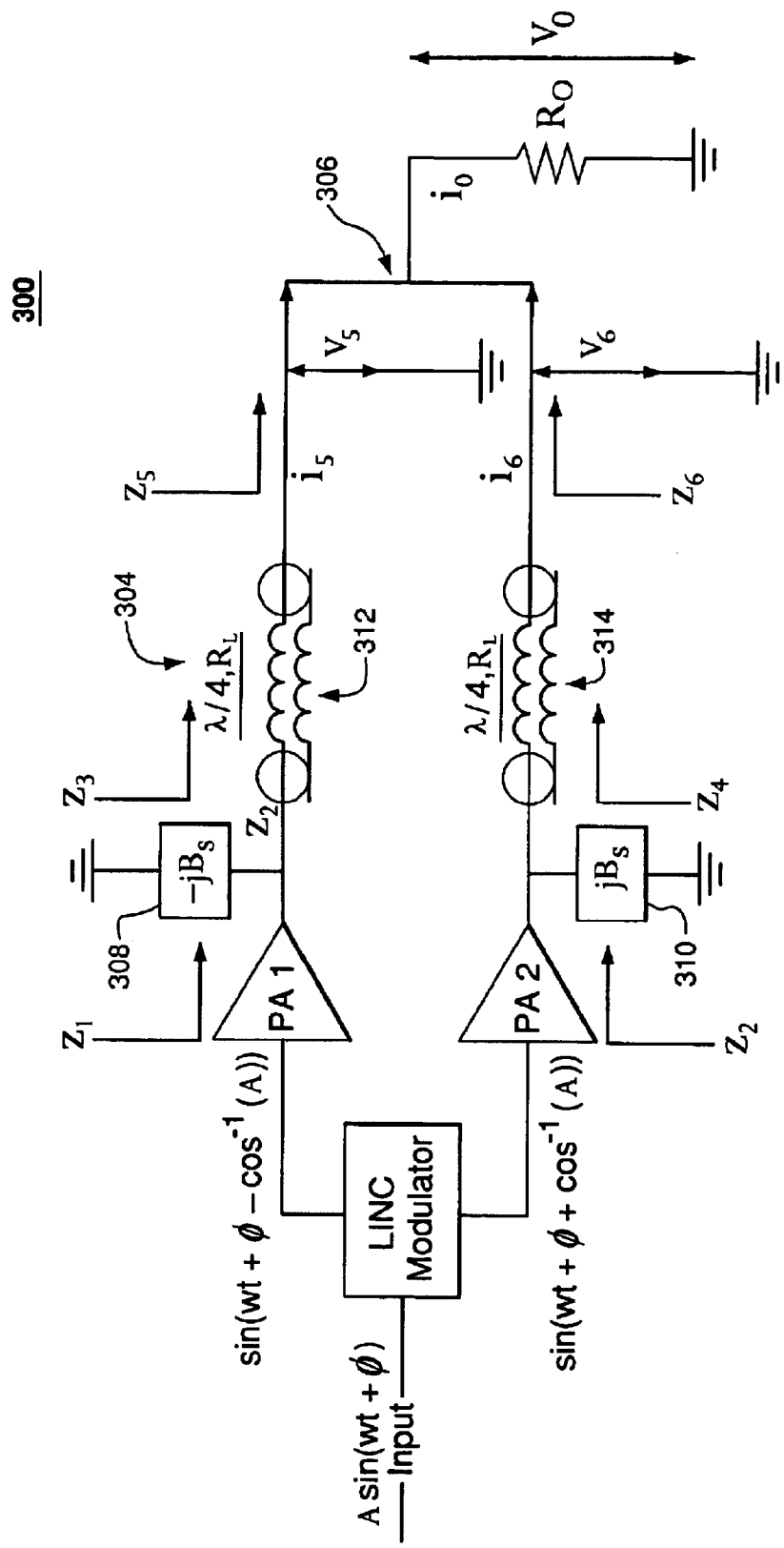
FIG. 3 shows a block diagram of a LINC system of the prior art that employs a second method for combining the amplified signals generated by two power amplifiers.

In the LINC system of FIG. 3, load matching is significantly improved, but is still not perfect. The changing gains of the amplifiers at various load conditions will cause both gain distortion (amplitude modulation to amplitude modulation or AM-AM distortion) and phase distortion (amplitude modulation to phase modulation or AM-PM distortion). According to embodiments of the present invention, the LINC system of FIG. 3 is linearized by pre-distorting the input signal in a manner that compensates for the distortion of the LINC system, which is usually measurable and consistent.

Figure 4:
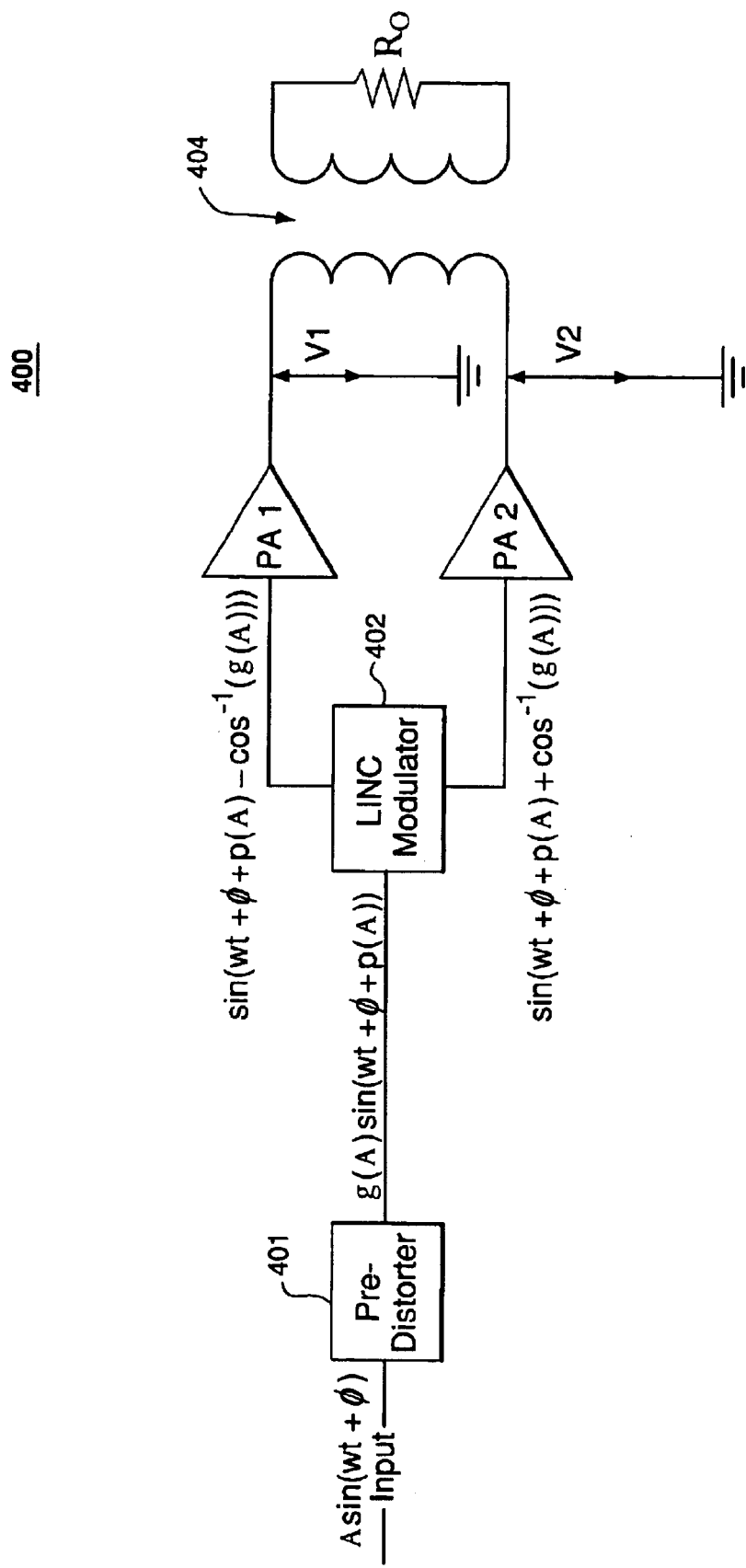
FIG. 4 shows a block diagram of a LINC system, according to one embodiment of the present invention.

FIG. 4 shows a block diagram of a LINC system 400, according to one embodiment of the present invention. LINC system 400 has pre-distorter 401, LINC modulator 402, power amplifiers PA1 and PA2, and combiner 404. In preferred implementations, power amplifiers PA1 and PA2 and combiner 404 are analogous to the power amplifiers and combiner of FIG. 3, where combiner 404 may be implemented as a transformer (as represented in FIG. 4) or as a transmission line tee with transmission line stubs for impedance matching (as represented in FIG. 3).

In one possible implementation, pre-distorter 401 and LINC modulator 402 are implemented using distinct circuitry, where LINC modulator 402 is analogous to the LINC modulator of FIG. 3 and pre-distorter 401 may be any suitable type of pre-distorter as is known in the art. In this case, LINC modulator 402 receives and processes the pre-distorted signal from pre-distorter 401 as its input.

In phasor notation, for the input signal of Equation (1), the output of pre-distorter 401 may be represented as in Equation (5) as follows:

$$u = g(A) e^{j(\phi + p(A))}, \quad (5)$$

where g(A) is the amplitude-dependent gain adjustment and p(A) is the amplitude-dependent phase adjustment of the of the pre-distortion processing. When this pre-distorted signal is applied to LINC modulator 402, the two LINC-modulated, pre-distorted outputs $x_1$ and $x_2$ may be represented as in Equations (6) and (7) as follows:

$$x_1 = e^{+j(\phi + p(A) - \cos^{-1} g(A))} \quad (6)$$

and $$x_2 = e^{+j(\phi + p(A) + \cos^{-1} g(A))}. \quad (7)$$

Figure 5:
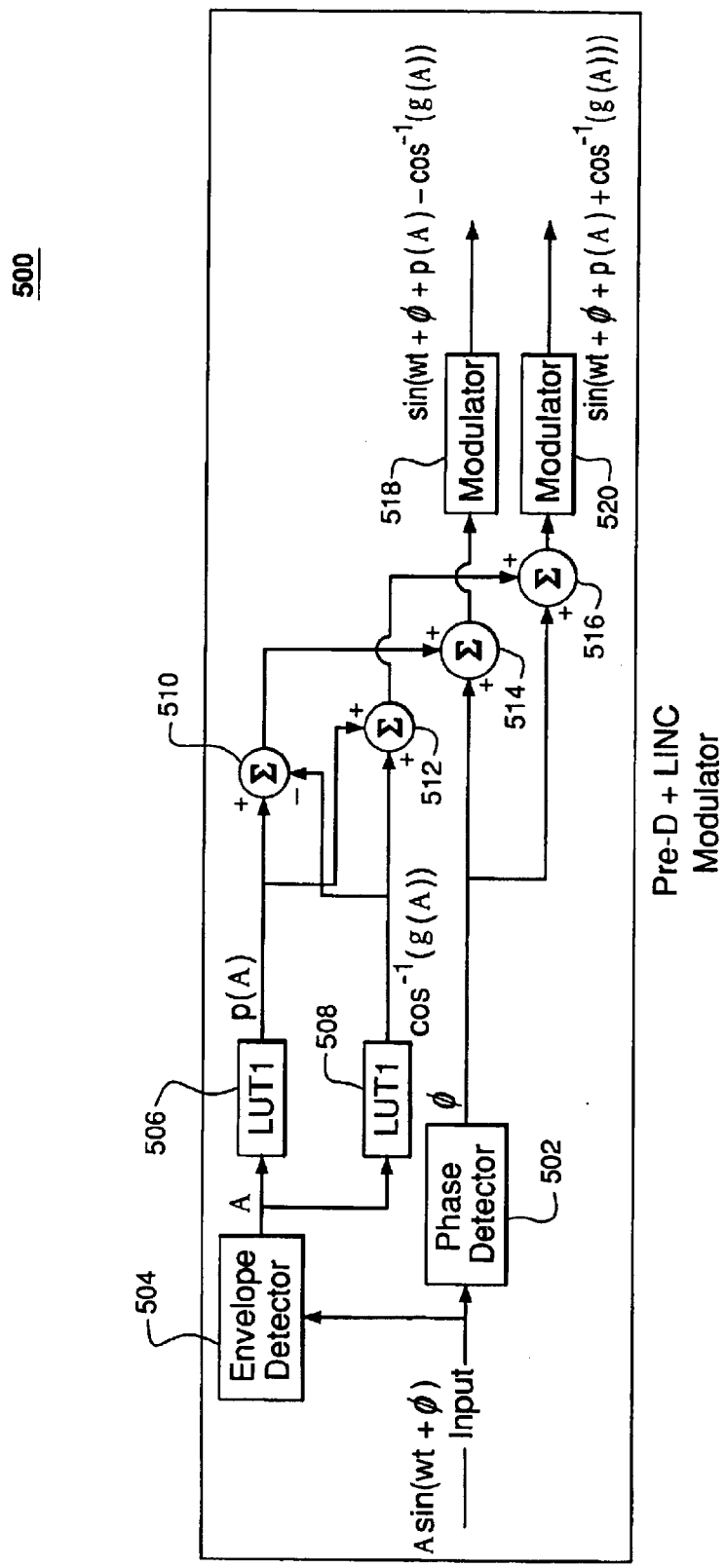
FIG. 5 shows a possible implementation of the pre-distorter and LINC modulator of the LINC system of FIG. 4, in which the pre-distortion and LINC modulation functions are performed by a single set of combined circuitry.

FIG. 5 shows a block diagram of a combined implementation of pre-distorter 401 and LINC modulator 402 of LINC system 400 of FIG. 4, according to an alternative embodiment of the present invention. According to this embodiment, the pre-distortion and LINC modulation functions are performed by a single set of combined circuitry 500.

In particular, combined pre-distortion/LINC modulation circuitry 500 comprises phase detector 502, envelope detector 504, look-up tables (LUTs) 506 and 508, difference node 510, summation nodes 512–516, and modulators 518–520. Phase detector 502 detects the phase of the input signal and applies the detected phase ϕ to summation nodes 514 and 516. Envelope detector 504 detects the amplitude of the input signal and applies the detected amplitude A to LUTs 506 and 508, which use the detected amplitude as an index into their respective stored data.

Each LUT is loaded with information based on the known distortion properties of the system. Such tables can be used to automatically correct for the gain and phase distortions of the amplifier. In particular, LUT 506 maps amplitude A to the amplitude-dependent, pre-distortion phase adjustment term p(A), while LUT 508 maps amplitude A to the amplitude-dependent, LINC modulation phase offset term $\cos^{-1}(g(A))$. Both of these LUT values are applied to difference node 510 and summation node 512.

Difference node 510 generates the difference between the two LUT values and applies the resulting difference to summation node 514. Summation node 512 generates the sum of the two LUT values and applies the resulting summation to summation node 516. The outputs of summation nodes 514 and 516 are applied to modulators 518 and 520, respectively.

Each modulator modulates its received summation signal at the carrier frequency w. As such, modulator 518 generates the LINC-modulated, pre-distorted output signal $x_1$ whose phasor representation is given by Equation (6), while modulator 520 generates the LINC-modulated, pre-distorted output signal $x_2$ whose phasor representation is given by Equation (7). The output signals $x_1$ and $x_2$ from modulators 518 and 520 are applied to power amplifiers PA1 and PA2, respectively, of LINC system 400 of FIG. 4.

If appropriate, the output signals can be monitored and the lookup tables adjusted for changes in the distortion properties of the system during operation.

Although combined circuitry 500 of FIG. 5 adds and subtracts different signals in a particular sequence, it will be understood that the present invention can alternatively be implemented using other sequences of addition and subtraction nodes that generate equivalent results.

The present invention may be implemented in the context of wireless signals transmitted from a base station to one or more mobile units of a wireless communication network. In theory, embodiments of the present invention could be implemented for wireless signals transmitted from a mobile unit to one or more base stations. The present invention can also be implemented in the context of other wireless and even wired communication networks to reduce spurious emissions.

Embodiments of the present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method for generating a linearized amplified output signal from an input signal having amplitude information, the method comprising:
    converting the input signal into two pre-distorted signals having the amplitude information converted into phase modulation;
    separately amplifying the two pre-distorted signals; and
    combining the two amplified, pre-distorted signals to generate the linearized amplified output signal.

2. The invention of claim 1, wherein:
    the input signal is an RF signal; and
    the linearized amplified output signal is an RF signal having amplitude information.

3. The invention of claim 1, wherein converting the input signal comprises:
    pre-distorting the input signal to generate a pre-distorted input signal having a pre-distorted amplitude; and
    converting the pre-distorted input signal into the two pre-distorted signals having the pre-distorted amplitude converted into phase modulation.

4. The invention of claim 3, wherein pre-distorting the input signal comprises pre-distorting both amplitude and phase of the input signal.

5. The invention of claim 1, wherein converting the input signal comprises:
    generating a phase pre-distortion term from the input signal;
    generating an amplitude pre-distortion term from the input signal;
    detecting phase of the input signal;
    combining the phase pre-distortion term, the amplitude pre-distortion term, and the phase in a first manner and modulating at a carrier frequency to generate a first pre-distorted signal having the amplitude information converted into phase modulation; and
    combining the phase pre-distortion term, the amplitude pre-distortion term, and the phase in a second manner and modulating at the carrier frequency to generate a second pre-distorted signal having the amplitude information converted into phase modulation.

6. The invention of claim 5, wherein generating the phase and amplitude pre-distortion terms comprise:
    detecting amplitude of the input signal;
    retrieving the phase pre-distortion term from a first look-up table based on the detected amplitude; and
    retrieving the amplitude pre-distortion term from a second look-up table based on the detected amplitude.

7. The invention of claim 5, wherein:
    in the first manner, the amplitude pre-distortion term is subtracted from the sum of the phase pre-distortion term and the phase; and
    in the second manner, the amplitude pre-distortion term is added to the sum of the phase pre-distortion term and the phase.

8. The invention of claim 1, wherein combining the two amplified, pre-distorted signals is implemented using a transformer.

9. The invention of claim 1, wherein combining the two amplified, pre-distorted signals is implemented using a transmission line tee with transmission stubs for impedance matching.

10. The invention of claim 9, wherein the transmission stubs comprise shunt reactances placed an electrical equivalent of one-quarter wavelength away from the transmission line tee.

11. An amplifier circuit adapted to generate a linearized amplified output signal from an input signal having amplitude information, the amplifier circuit comprising:
    means for converting the input signal into two pre-distorted signals having the amplitude information converted into phase modulation;
    means for separately amplifying the two pre-distorted signals; and
    means for combining the two amplified, pre-distorted signals to generate the linearized amplified output signal.

12. An amplifier circuit adapted to generate a linearized amplified output signal from an input signal having amplitude information, the amplifier circuit comprising:
    circuitry adapted to convert the input signal into two pre-distorted signals having the amplitude information converted into phase modulation;
    two amplifiers adapted to separately amplify the two pre-distorted signals; and
    a combiner adapted to combine the two amplified, pre-distorted signals to generate the linearized amplified output signal.

13. The invention of claim 12, wherein:
    the input signal is an RF signal; and
    the linearized amplified output signal is an RF signal having amplitude information.

14. The invention of claim 12, wherein the circuitry adapted to convert the input signal comprises:
    a pre-distorter adapted to pre-distort the input signal to generate a pre-distorted input signal having a pre-distorted amplitude; and
    a LINC modulator adapted to convert the pre-distorted input signal into the two pre-distored signals having the pre-distorted amplitude converted into phase modulation.

15. The invention of claim 14, wherein the pre-distorter is adapted to pre-distort both amplitude and phase of the input signal.

16. The invention of claim 12, wherein the circuitry adapted to convert the input signal comprises:
    circuitry adapted to generate a phase pre-distortion term from the input signal;
    circuitry adapted to generate an amplitude pre-distortion term from the input signal;
    a phase detector adapted to detect phase of the input signal;
    circuitry adapted to combine the phase pre-distortion term, the amplitude pre-distortion term, and the phase in a first manner and modulating at a carrier frequency to generate a first pre-distorted signal having the amplitude information converted into phase modulation; and
    circuitry adapted to combine the phase pre-distortion term, the amplitude pre-distortion term, and the phase in a second manner and modulating at the carrier frequency to generate a second pre-distorted signal having the amplitude information converted into phase modulation.

17. The invention of claim 16, wherein the circuitry adapted to generate the phase and amplitude pre-distortion terms comprises:

an envelope detector adapted to detect amplitude of the input signal;

a first look-up table adapted to provide the phase pre-distortion term based on the detected amplitude; and a second look-up table adapted to provide the amplitude pre-distortion term based on the detected amplitude.

18. The invention of claim 16, wherein:

the circuitry adapted to combine the phase pre-distortion term, the amplitude pre-distortion term, and the phase in the first manner is adapted to generate a signal corresponding to the amplitude pre-distortion term subtracted from the sum of the phase pre-distortion term and the phase; and the circuitry adapted to combine the phase pre-distortion term, the amplitude pre-distortion term, and the phase in the second manner is adapted to generate a signal corresponding to the amplitude pre-distortion term added to the sum of the phase pre-distortion term and the phase.

19. The invention of claim 18, wherein the circuitry adapted to generate the first and second pre-distorted signals comprises:

a subtraction node adapted to subtract the amplitude pre-distortion term from the phase pre-distortion term;

a first addition node adapted to add the amplitude pre-distortion term to the phase pre-distortion term;

a second addition node adapted to add the phase to the output from the subtraction node;

a first modulator adapted to modulate the output from the second addition node at the carrier frequency to generate the first pre-distorted signal;

a third addition node adapted to add the phase to the output from the first addition node; and a second modulator adapted to modulate the output from the third addition node at the carrier frequency to generate the second pre-distorted signal.

20. The invention of claim 12, wherein the combiner comprises a transformer.

21. The invention of claim 12, wherein combiner comprises a transmission line tee with transmission stubs for impedance matching.

22. The invention of claim 21, wherein the transmission stubs comprise shunt reactances placed an electrical equivalent of one-quarter wavelength away from the transmission line tee.

* * * * *